United States Patent [19]

Akiyama

[11] Patent Number: 5,289,384
[45] Date of Patent: Feb. 22, 1994

[54] DEVICE SIMULATOR FOR SEMICONDUCTOR DEVICE

[75] Inventor: Yutaka Akiyama, Tokyo, Japan

[73] Assignee: NEC Corporation, Tokyo, Japan

[21] Appl. No.: 824,050

[22] Filed: Jan. 23, 1992

[30] Foreign Application Priority Data

Feb. 6, 1991 [JP] Japan .................................. 3-36924

[51] Int. Cl.$^5$ ............................................. G06F 15/20
[52] U.S. Cl. ................................... 364/488; 364/578
[58] Field of Search ............................... 364/488, 578

[56] References Cited

U.S. PATENT DOCUMENTS 5,103,415  4/1992  Omura et al. ...................... 364/578

OTHER PUBLICATIONS

Ryo Dan ed., "Process Device Simulation Technique", Sangyo Tosho, 1988, pp. 1-9.
Kawazoe et al., "Application of 2D Device Simulator to Development of CCD Image Sensor", the 37th Applied Physics Association Joint Lecture Meeting Manuscripts, the 0th Separate vol., 1990, spring, pp. 1,208.
Kitamura et al., "Sensitivity Simulation of a Frame Transfer CCD Image Sensor", the 37th Applied Physics Association Joint Lecture Meeting Manuscripts, the 2nd Separate vol., 1990, spring, p. 629.

*Primary Examiner*—Edward R. Cosimano
*Attorney, Agent, or Firm*—Laff, Whitesel, Conte & Saret

[57] ABSTRACT

It is an object of this invention to make it possible to accurately simulate a manner in which carriers are transferred in a semiconductor device. A Fermi level setting means sets a Fermi level in a sink region of carriers, such as a vertical CCD portion of a CCD, and Boltzmann distribution equation solving means solve a Boltzmann distribution equation to obtain a carrier density in this Fermi level set region. In a CCD, the manner in which carriers are transferred from a photodiode portion to a vertical CCD portion in a CCD can be simulated accurately.

6 Claims, 7 Drawing Sheets

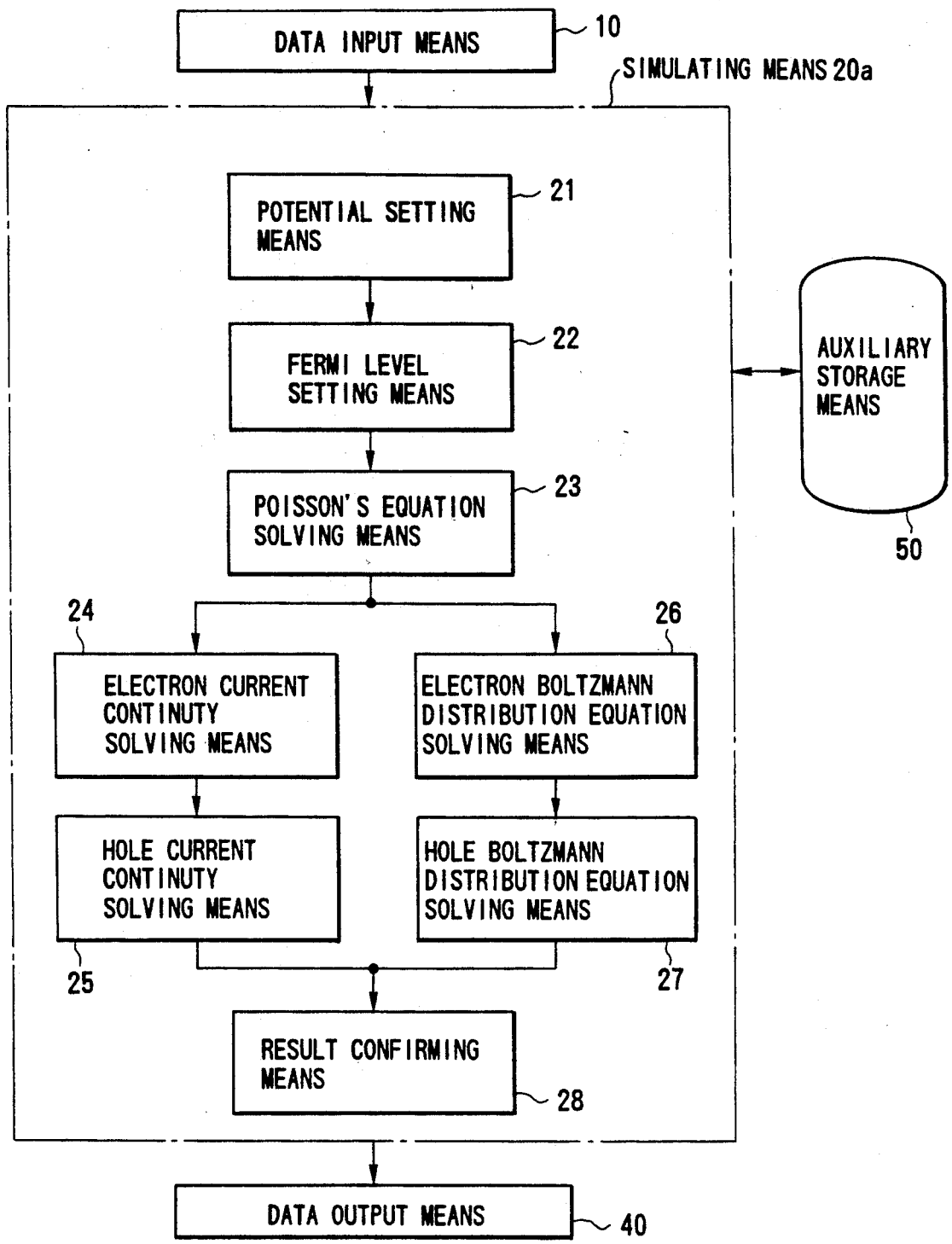
F I G. 1

DEVICE SIMULATOR FOR SEMICONDUCTOR DEVICE

BACKGROUND OF THE INVENTION

The present invention relates to a device simulator for analyzing an operation of a semiconductor device and, more particularly, to a device simulator for two-dimensionally analyzing a three dimensional device structure.

FIGS. 5 and 6 are block diagrams showing first and second examples of a conventional device simulator, in which FIG. 5 shows a decouple method, and FIG. 6 shows a couple method. (Ryo Dan ed., "Process Device Simulation Technique," pp. 4 to 9, Sangyo Tosho).

The first conventional example of FIG. 5 comprises a data input means 10, a simulating means 20c, a data output means 40, and an auxiliary storage unit 50. The simulating means 20c includes a potential setting means 21, a Poisson's equation solving means 23, an electron current continuity solving means 24, a hole current continuity solving means 25, and a result confirming means 28. For semiconductor fundamental equation data supplied by the data input means 10, the simulating means 20c applies a potential to electrodes by using the potential setting means 21 and sequentially solves a Poisson's equation, an electron current continuity, and a hole current continuity for an entire region except for the electrodes by using the respective solving means 23 to 25 while checking the convergences. After the result confirming means 28 confirms the result, the data output means 40 outputs the result.

The second conventional example of FIG. 6 comprises, in place of the solving means 23, 24, and 25 shown in FIG. 5, a Poisson's equation current continuity solving means 29 as a simulating means 20d. This second conventional example solves a Poisson's equation, an electron current continuity, and a hole current continuity in a batch manner and checks the convergence.

Note that as the solution of a semiconductor fundamental equation data described above, a solution using a numerical analysis such as calculus of finite differences has been established in the case of a two dimensional model.

A conventional analysis scheme for analyzing a charge coupled, device (referred to as a CCD hereinafter) as a three dimensional structure by using a tow dimensional device simulator will be described below. In a CCD 60 as shown in FIG. 7, carriers produced by light incident on a photodiode portion 61 are transferred to a vertical CCD portion 63 by a potential applied to a transfer gate portion 62. The carriers transferred to the vertical CCD portion 63 are transferred to the direction of depth (the direction perpendicular to the drawing surface of FIG. 7) of the CCD 60 by a potential difference applied in the direction of depth of the CCD 60. In the conventional analysis scheme, in order to analyze a potential distribution below the transfer gate, dummy electrodes are provided in the vertical CCD portion 63. A voltage is applied to the dummy electrodes until a region including the dummy electrodes is depleted sufficiently, thereby performing a simulation. Thereafter, another simulation is performed again after the dummy electrodes are removed, thus checking the physical quantity distribution inside the semiconductor. (Kawazoe et al., Application of 2D Device Simulator to Development of CCD Image Sensor, 1990, spring, the 37th Applied Physics Association Joint Lecture Meeting Manuscripts, the 0th Separate Volume, page 1,208; and Kitamura et al., Sensitivity Simulation of a Frame Transfer CCD Image Sensor, 1990, spring, the 37th Applied Physics Association Joint Lecture Meeting Manuscripts, the 2nd Separate Volume, page 629.)

In the conventional 2D device simulation system of Kawazoe or Kitamura, in order to check the physical quantity inside a device, dummy electrodes which provide as a carrier transfer portion to the vertical CCD portion are detached in order to perform the simulation. Therefore, since no place is present to absorb carriers transferred from the photodiode portion to the vertical CCD portion, no current can flow. As a result, it is impossible to analyze the manner in which carriers produced in the photodiode portion are transferred to the vertical CCD portion.

SUMMARY OF THE INVENTION

An object of the present invention is to provide a device simulator for a semiconductor device, which can analyze the manner in which carriers flow in a semiconductor.

Another object of the present invention is to provide a device simulator for a semiconductor device, which can accurately analyze the manner in which carriers produced in a photodiode portion of a CCD are transferred to a vertical CCD portion.

In order to achieve the above objects of the present invention, there is provided a device simulator for a semiconductor device, comprising potential setting means for setting an arbitrary potential in electrodes formed on a semiconductor region, Poisson's equation solving means for solving a Poisson's equation, Fermi level setting means for setting a Fermi level in an arbitrary region of the semiconductor region, and Boltzmann distribution equation solving means for calculating a carrier density from a Boltzmann distribution equation of carriers in the Fermi level set region set by the Fermi level setting means.

BRIEF DESCRIPTION OF THE DRAWINGS

FIG. 1 is a block diagram showing the arrangement of the first embodiment of the present invention;

DETAILED DESCRIPTION OF THE PREFERRED EMBODIMENTS

Figure 2:
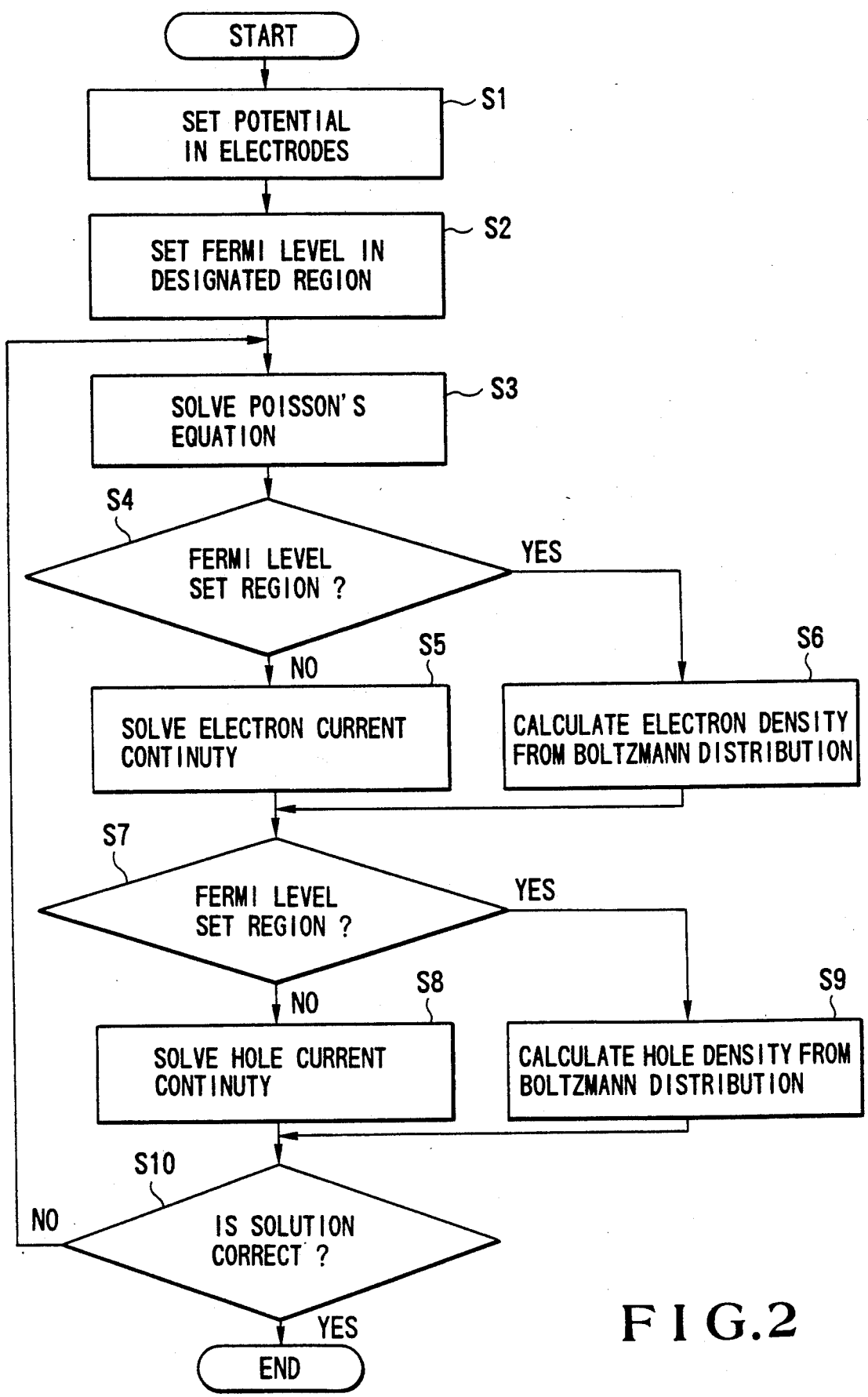
FIG. 2 is a flow chart for explaining the procedure of a simulating means shown in FIG. 1.

Embodiments of the present invention will be described below with reference to the accompanying drawings.

FIG. 1 shows the arrangement of the first embodiment of the present invention, which is based on a sequential method.

This first embodiment comprises a data input means 10 such as a magnetic tape for inputting data of a semiconductor fundamental equation, a simulating means 20a for performing a simulation for the input data, a data output means 40 such as a line printer for outputting data of the simulation result, and an auxiliary storage means 50 for storing the processed data.

The simulating means 20a includes a potential setting means 21 for setting an arbitrary potential for electrodes formed in a CCD, a Fermi level setting means 22 for setting a Fermi level in an arbitrary region of the CCD, a Poisson's equation solving means 23 for solving a Poisson's equation, an electron current continuity solving means 24 for solving an electron current continuity, an electron Boltzmann distribution equation solving means 26 for solving an electron Boltzmann distribution equation, a hole current continuity solving means 25 for solving a hole current continuity, a hole Boltzmann distribution equation solving means 27 for solving a hole Boltzmann distribution equation, and a result confirming means 28 for confirming the simulation result. The respective solving means 23 to 27 constitute a semiconductor fundamental equation solving means.

The characteristic feature of the present invention is that in FIG. 1, the simulating means 20a includes the Fermi level setting means 22, and the electron Boltzmann distribution equation solving means 25 and the hole Boltzmann distribution equation solving means 27 as Boltzmann distribution equation solving means for obtaining a carrier density from a Boltzmann distribution equation in a Fermi level set region. Note that the simulating means 20a is incorporated in, e.g., a central processing unit.

The procedure of the simulating means 20a of FIG. 1 will be described below with reference to a flow chart shown in FIG. 2. First, the potential setting means 21 sets an arbitrary potential for the electrodes formed in the CCD (step S1). The Fermi level setting means 22 sets an arbitrary Fermi level in an arbitrary region of the CCD (step S2). The Poisson's equation solving means 23 solves a Poisson's equation (step S3). In step S4, whether a region is the Fermi level set region is checked. The electron current continuity solving means 24 solves an electron current continuity for the entire region except for the Fermi level set region (step S5). In the Fermi level set region, the electron Boltzmann distribution equation solving means 26 calculates an electron density from a Boltzmann distribution (step S6).

Step S7 checks whether a region is the Fermi level set region. The hole current continuity solving means 25 solves a hole current continuity for the entire region except for the Fermi level set region (step S8). In the Fermi level set region, the hole Boltzmann distribution equation solving means 27 calculates a hole density from a Boltzmann distribution (step S9). Finally, the result confirming means 28 checks whether the obtained solution is correct. If the solution is correct, the processing is ended. If the solution is incorrect, the data processing flow returns to step S3, and the processing is repeated until a correct solution is obtained (step S10).

Figure 3:
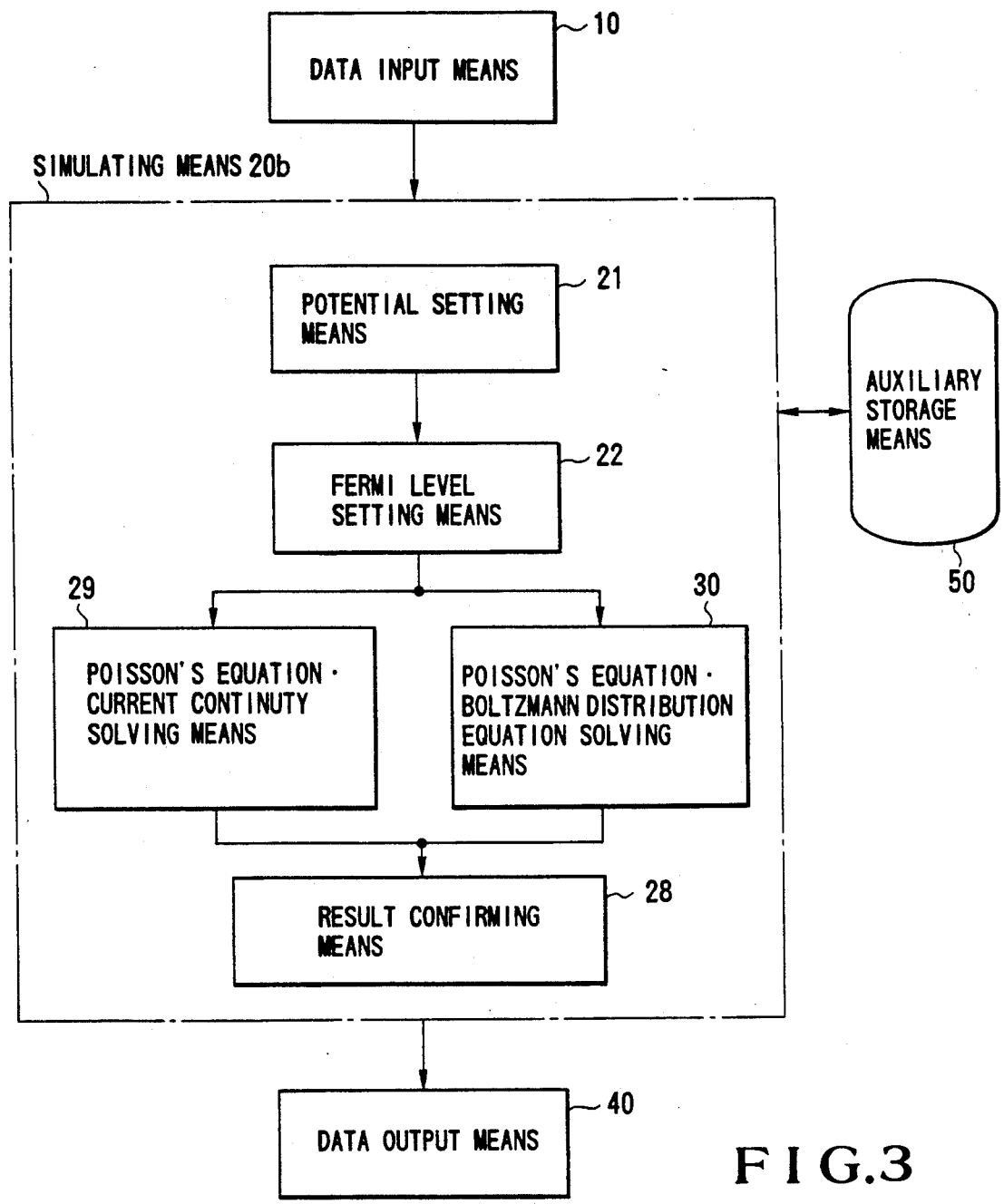
FIG. 3 is a block diagram showing the arrangement of the second embodiment of the present invention.

FIG. 3 is a block diagram showing the arrangement of the second embodiment of the present invention, which is based on a batch method.

In this second embodiment, a Poisson's equation.current continuity solving means 29 is provided as a simulating means 20b in place of the Poisson's equation solving means 23, the electron current continuity solving means 24, and the hole current continuity solving means 25 of the simulating means 20a of the first embodiment shown in FIG. 1. In addition, in place of the Poisson's equation solving means 23, the electron Boltzmann distribution equation solving means 26, and the hole Boltzmann distribution equation solving means 27, a Poisson's equation.Boltzmann distribution equation solving means 30 which is the characteristic feature of the present invention is provided.

The Poisson's equation.current continuity solving means 20 solves a Poisson's equation, an electron current continuity, and a hole current continuity in a batch manner, and also checks a convergence. The Poisson's equation.Boltzmann distribution equation solving means 30 solves a Poisson's equation, an electron Boltzmann distribution equation solving means 30 solves a Poisson's equation, an electron Boltzmann distribution equation and a hold Boltzmann distribution equation in a batch matter and checks a convergence.

Figure 4:
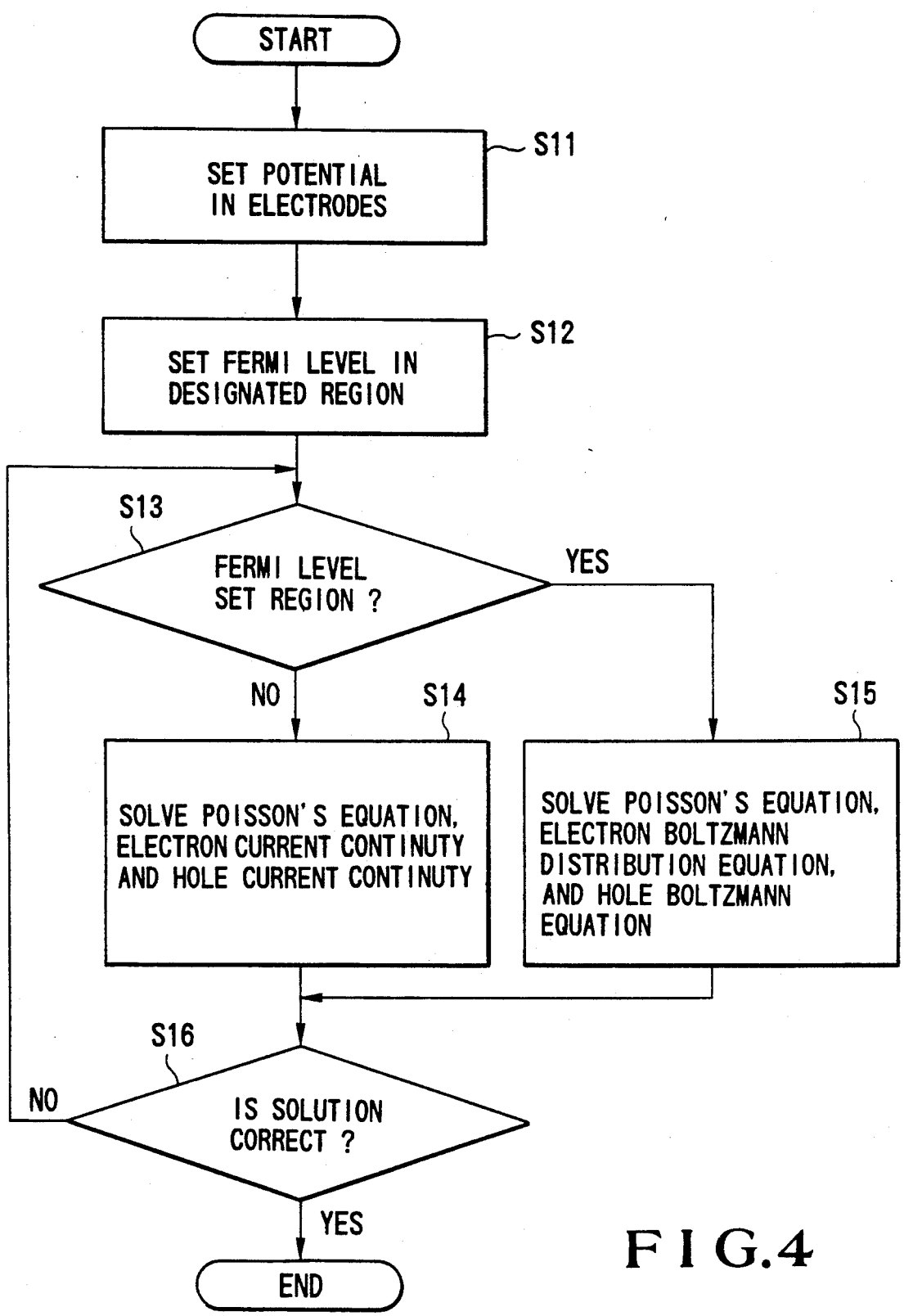
FIG. 4 is a flow chart for explaining the procedure of a simulating means shown in FIG. 3.
Figure 5:
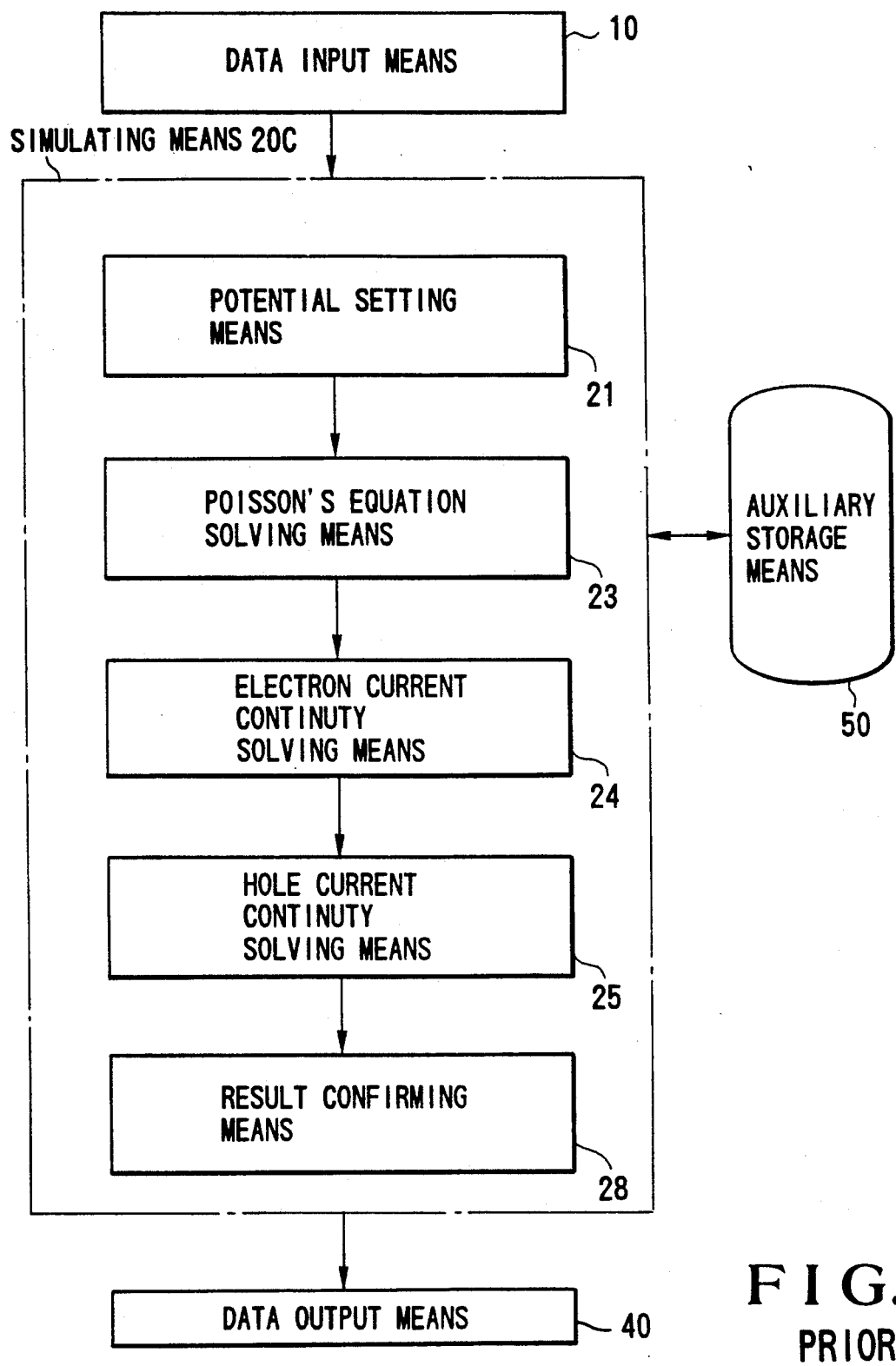
FIG. 5 is a block diagram showing the arrangement of a first conventional example.
Figure 6:
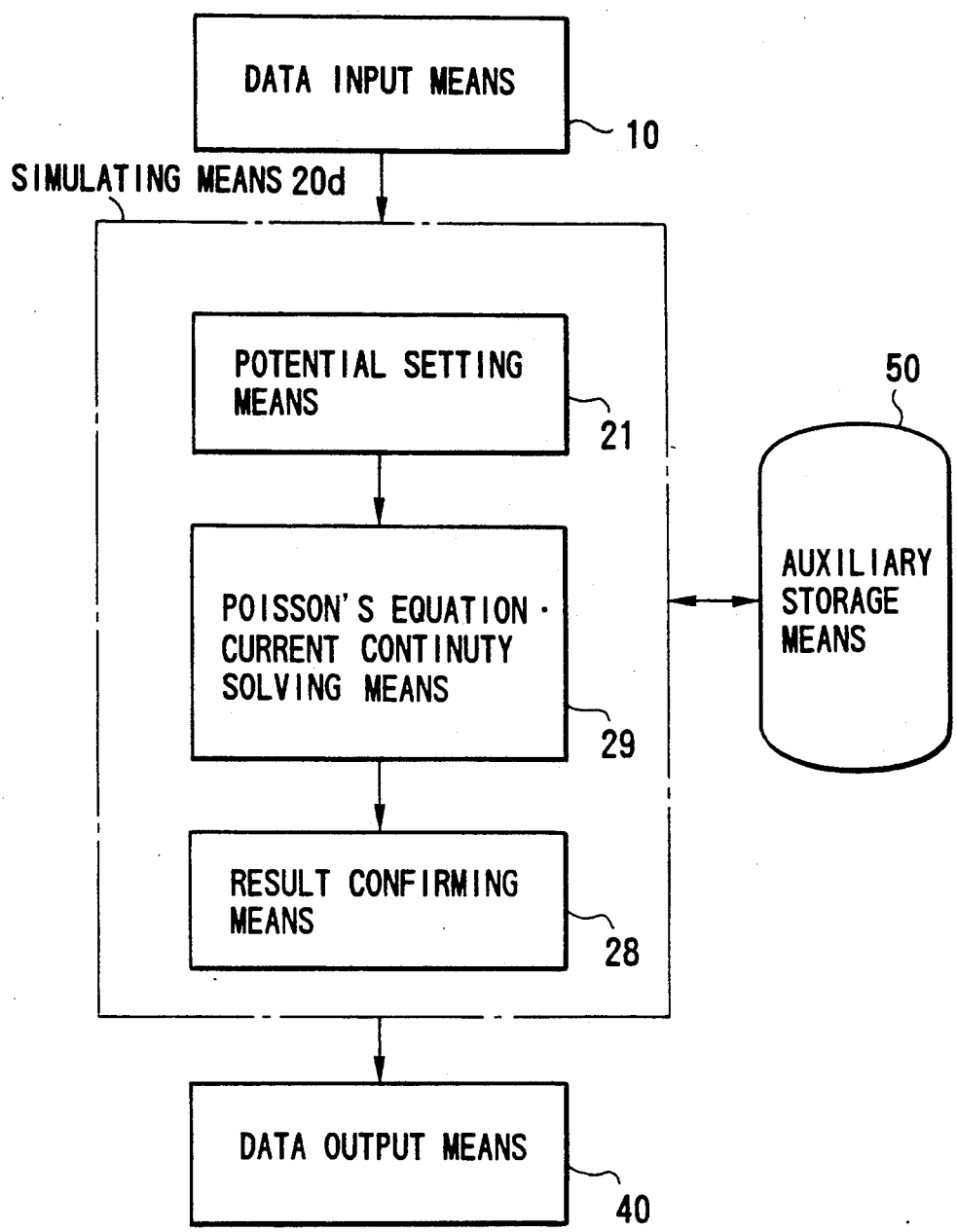
FIG. 6 is a block diagram showing the arrangement of a second conventional example.
Figure 7:
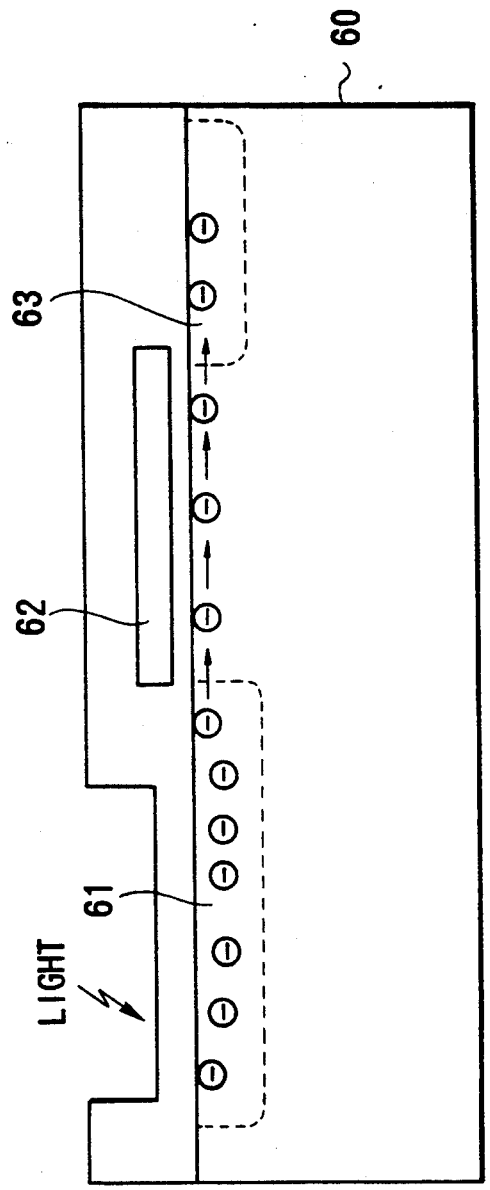
FIG. 7 is a sectional view for explaining the structure of a CCD to which the present invention is applied.

The procedure of the simulating means 20b of FIG. 3 will be described below with reference to a flow chart shown in FIG. 4. First, the potential setting means 21 sets an arbitrary potential for electrodes formed in a CCD (step S11). A Fermi level setting means 22 sets an arbitrary Fermi level in an arbitrary region of the CCD (step S12). Step S13 checks whether a region is the Fermi level set region. The Poisson's equation.current continuity solving means 29 solves an electron current continuity and a hole current continuity for the entire region except for the Fermi level set region (step S14). In the Fermi level set region, the Poisson's equation.-Boltzmann distribution equation, solving means 30 solves a Poisson's equation and the electron Boltzmann distribution equation, and the hold Boltzmann distribution equation (step S15) representing the relationship between the carrier density and the potential in the form of a Boltzmann distribution.

Finally, the result confirming means 28 checks whether the obtained solution is correct. If the solution is correct, the processing is ended. If the solution is incorrect, the data processing flow returns to step S13, and the processing is repeated until a correct solution is obtained (step S16).

Although the above embodiments have been described by taking a CCD as an example, the present invention can similarly apply to another semiconductor device.

As has been described above, the present invention sets a Fermi level to perform an analysis in analyzing a three dimensional structure such as a CCD by using a two dimensional device simulator. Therefore, it is possible to effectively analyze the manner in which carriers are transferred from a photodiode portion to a vertical CCD portion.

What is claimed is:

1. A device simulator for a semiconductor device, comprising:
   potential setting means for setting an arbitrary potential in electrodes formed on a semiconductor;
   Fermi level setting means for setting a Fermi setting region in the semiconductor region and a Fermi level in the Fermi setting region; and
   Poisson's equation solving means for solving a Poisson's equation in accordance with outputs of said potential setting means and said Fermi level setting means; and
   Boltzmann distribution equation solving means for calculating a carrier density from a Boltzmann distribution equation of carriers in accordance with outputs of said Poisson's equation solving means and said Fermi level setting means in the Fermi level setting region which is set by said Fermi level setting means.

2. A simulator according to claim 1, wherein said Boltzmann distribution equation solving means comprises electron Boltzmann distribution equation solving means for calculating an electron density and hole density distribution equation solving means for calculating a hole density.

3. A simulator according to claim 1, further comprising current continuity solving means for solving a current continuity of carriers in an entire region except for the Fermi level set region set by said Fermi level setting means.

4. A simulator according to claim 1, wherein said Poisson's equation solving means and said Boltzmann distribution equation solving means are constituted by Poisson's equation.Boltzmann distribution equation solving means for solving an equation representing a relationship between a carrier density and a potential in the form of a Boltzmann distribution.

5. A simulator according to claim 1, wherein a three dimensional charge coupled device having a photodiode portion and a vertical CCD portion is formed in the semiconductor region, and a manner in which carriers produced in said photodiode portion are transferred to said vertical CCD portion is analyzed from the carrier density calculated by said Boltzmann distribution equation solving means.

6. A device simulator for a semiconductor device, comprising:
   potential setting means for setting an arbitrary potential in electrodes formed on a semiconductor;
   Fermi level setting means for setting a Fermi setting region in the semiconductor region and a Fermi level in the Fermi setting region;
   Poisson's equation solving means for calculating a internal potential of the semiconductor from Poisson's equation with boundary conditions of the potential set by said potential setting means and the Fermi level set by said fermi level setting means; and
   Boltzmann distribution equation solving means for calculating a carrier density from a Boltzmann distribution equation of carriers with the internal potential calculated by said Poisson's equation solving means the Fermi level set by said Fermi level setting means in the Fermi level setting region.

* * * * *